United States Patent [19]
Harris et al.

[11] Patent Number: 5,093,435
[45] Date of Patent: Mar. 3, 1992

[54] MOLDED ELECTRICAL DEVICE AND COMPOSITION THEREFORE

[75] Inventors: James E. Harris, Piscataway; Lloyd M. Robeson, Whitehouse Station; Stephen B. Rimsa, Lebanon, all of N.J.

[73] Assignee: Amoco Corporation, Chicago, Ill.

[21] Appl. No.: 422,647

[22] Filed: Oct. 17, 1989

Related U.S. Application Data

[63] Continuation of Ser. No. 942,314, Dec. 16, 1986, abandoned, which is a continuation of Ser. No. 777,750, Sep. 18, 1985, abandoned, which is a continuation of Ser. No. 626,147, Jun. 29, 1984, abandoned.

[51] Int. Cl.$^5$ .................. C08L 67/02; C08L 71/10; C08L 77/00; C08L 81/06
[52] U.S. Cl. .................. 525/420; 525/425; 525/432; 525/437; 525/444; 525/534; 525/537
[58] Field of Search ............... 525/420, 437, 534, 537

[56] References Cited

U.S. PATENT DOCUMENTS

| 3,742,087 | 6/1973 | Nield | 525/437 |
| 4,012,596 | 5/1977 | Bailey | 525/537 |
| 4,520,067 | 5/1985 | Harris | 428/323 |
| 4,550,140 | 10/1985 | Rimsa | 525/132 |
| 4,906,500 | 3/1990 | McKenna | 525/437 |

*Primary Examiner*—Patricia Short
*Attorney, Agent, or Firm*—William E. Murray; William H. Magidson; Ralph C. Medhurst

[57] ABSTRACT

This invention is directed to a molded electrical device comprising an electrically conductive pathway and an insulating material, and capable of interconnecting with external circuitry said insulating material comprising a blend of a particular amorphous polymer and a particular crystalline thermoplastic polymer. Also, this invention is directed to a composition suitable for use as an insulating material in an electrical device comprising from about 35 to about 65 weight percent of an amorphous polymer selected from a polyarylethersulfone resin, a polyarylether resin, a polyetherimide or a polyarylate, and from about 65 to about 35 weight percent of a crystalline polymer selected from a poly(arylene sulfide), a polyester or a polyamide.

10 Claims, No Drawings

MOLDED ELECTRICAL DEVICE AND COMPOSITION THEREFORE

This is a continuation of application Ser. No. 942,314, filed Dec. 16, 1986, now abandoned, which is a continuation of Ser. No. 777,750 filed Sept. 18, 1985, now abandoned, which is a continuation of Ser. No. 626,147 filed June 29, 1984, now abandoned.

BACKGROUND OF THE INVENTION

This invention is directed to a molded electrical device comprising an electrically conductive pathway and an insulating material, the device being capable of interconnection with external circuitry, said insulating material comprising a blend of a particular amorphous thermoplastic polymer and a particular crystalline thermoplastic polymer. Also, this invention is directed to a composition suitable for use as an insulating material in an electrical device comprising from about 35 to about 65 weight percent of an amorphous polymer selected from a polyarylethersulfone resin, a polyarylether resin, a polyetherimide, or a polyarylate and from about 65 to about 35 weight percent of a crystalline polymer selected from a poly(arylene sulfide), a polyester, or a polyamide.

It is well known that a wide variety of thermoplastic polymers have been used as substrates for electrical components, such as circuit board substrates. These substrates have been molded from, for example, polyphenyleneoxide, polyphenylenesulfide, polyimide and polyethersulfone. Additionally, the following U.S. Patent Applications disclose substrates made from thermoplastic polymers:

U.S. patent application Ser. No. 516,863, filed in the name of J. E. Harris et al, on July 25, 1983, titled "A Composition Useful For Making Circuit Board Substrates and Electrical Connectors" (commonly assigned) describes a composition useful for making circuit board substrates and electrical connectors comprising a blend of certain proportions of a poly(ether sulfone) and a polysulfone.

U.S. patent application Ser. No. 566,298, filed in the name of H. Chao et al, on Dec. 28, 1983, titled "A Polymer Useful For Molding Into A Circuit Board Substrate" (commonly assigned) describes a select polyarylethersulfone which is useful for molding into circuit board substrates.

U.S. patent application Ser. No. 448,376, filed in the name of J. E. Harris, on Dec. 9, 1982, titled "A Composition Useful For Making Circuit Board Substrates And/or Electrical Connectors" (commonly assigned) describes a composition comprising a blend of a poly(aryl ether), a poly(etherimide) polymer, a fiber and a filler which is useful for making circuit board substrates and/or electrical connectors.

The polymers described above are used as circuit board substrates and in other electrical devices such as chip carriers. These materials are solderable by hand or wave soldering techniques. However, unlike hand and wave soldering, vapor phase soldering (VPS) constitutes a considerably more rigorous form of thermal exposure (as, for example, temperatures of about 420° F., and times of exposure of the substrate of from 30 seconds to in excess of 2 minutes). Unlike wave soldering which involves momentary exposure of the device to temperatures of 500° F., VPS requires that the electrical device be totally immersed in the soldering media.

Thus, amorphous resin containing formulations that performed satisfactorily in hand and wave soldering exhibit deficiencies upon VPS exposure, i.e., they exhibit bubbles, blisters, distortion, and foaming. This is attributed to relatively high moisture absorption and low apparent modulus at the VPS processing temperature of the substrate made from amorphous resins.

Crystalline resin systems, on the other hand, have been found to exhibit low moisture absorption and a relatively high modulus at VPS processing temperatures. For example, mineral and/or glass-filled/reinforced poly(ethylene terephthalate) has demonstrated exceptional resistance to bubbling, blistering, and foaming in VPS exposure. However, while possibly suited for making small articles such as chip carriers, filled/reinforced poly(ethylene terephthalate) systems are unacceptable for printed wiring board fabrication due to anisotropic behavior which results in severe bow and warp of the fabricated wiring board. Thus, there is a desire to develop a resin formulation which can be used to fabricate a large variety of molded electrical devices requiring VPS exposure and which maintain their dimensional integrity after VPS exposure.

THE INVENTION

In the present invention it has been found that the combination of a particular amorphous thermoplastic polymer and a particular crystalline thermoplastic polymer provides a material which is useful as an electrical/support element in electrical devices, is vapor phase solderable, and maintains its dimensional integrity.

The present invention is also directed to a molded electrical device comprising an electrically conductive pathway and an insulating material, the device being capable of interconnection with external circuitry, said insulating material comprising a blend of a particular amorphous thermoplastic polymer and a particular crystalline thermoplastic polymer.

Further, this invention is directed to a composition suitable for use as an insulating material in an electrical device comprising from about 35 to about 65 weight percent, preferably from about 40 to about 60 weight percent, and most preferably about 50 weight percent, of an amorphous thermoplastic polymer selected from a polyarylethersulfone, a polyarylether resin, a polyetherimide, or a polyarylate, and from about 65 to about 35 weight percent, preferably from about 40 to about 60 weight percent, and most preferably about 50 weight percent of a crystalline polymer selected from a poly(arylene sulfide), a polyester, or a polyamide.

Preferred compositions include blends of polyarylethersulfone with poly(arylene sulfide) or polyesters or polyamides or mixtures of one or more of these; polyarylether with poly(arylene sulfide) or polyesters or polyamides. Most preferred compositions include mixtures of polyarylethersulfone and polyesters, particularly poly(ethylene terephthalate); mixtures of polyarylethers and polyesters; mixtures of polyarylethersulfone and poly(arylene sulfide) or mixtures of polyarylethers and poly(arylene sulfide).

THE ELECTRICAL DEVICE

The electrical device of this invention includes chip carriers which are holders for microcircuits with contacts and wire bonding pads used to protect the microcircuit and interconnect it with a printed circuit board; printed circuit boards as an extruded injection moldable, or laminated support for additive or substractively produced circuit elements and components; electrical connectors which are assemblies of conducting elements arranged in the insulating material of this invention and used for circuit element interconnection.

The chip carrier, printed circuit board and electrical connectors are made by well known methods in the art such as by injection, compression, or transfer molding or by lamination. Representative methods are described in, for example, U.S. Pat. Nos. 4,147,889 and 3,975,757.

THE AMORPHOUS POLYMERS

A. Polyarylethersulfones

The polyarylethersulfones of this invention are amorphous thermoplastic polymers containing units of the formula:

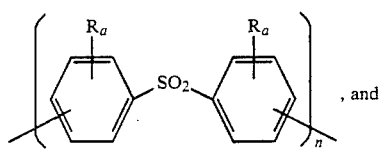, and (I)

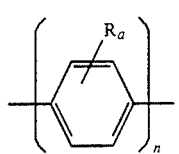 (II)

and/or

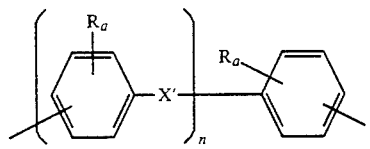 (III)

wherein R is independently hydrogen, $C_1$ to $C_6$ alkyl or $C_4$ to $C_8$ cycloalkyl, X' is independently $$-\overset{R_1}{\underset{R_2}{C}}-$$

wherein $R_1$ and $R_2$ are independently hydrogen or $C_1$ to $C_9$ alkyl, or

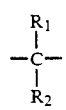

wherein $R_3$ and $R_4$ are independently hydrogen or $C_1$ to $C_8$ alkyl, and $a_1$ is an integer of 3 to 8; —S—, —O—, or

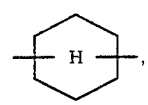

a is an integer of 0 to 4 and n is independently an integer of 1 to 3 and wherein the ratio of unit (I) to the sum of units (II) and/or (III) is greater than 1. The units are attached to each other by an —O— bond.

A preferred polymer of this invention contains units of the formula:

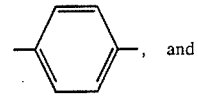

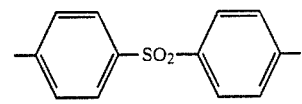

Another preferred polyarylethersulfone of this invention contains units of the formula:

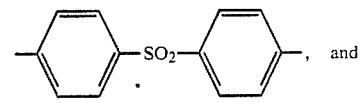

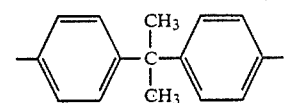

These units are attached to each other by an —O— bond.

The polyarylethersulfone may be random or may have an ordered structure.

The polyarylethersulfones of this invention have a reduced viscosity of from about 0.4 to greater than about 2.5, as measured in N-methylpyrolidone, or other suitable solvent, at 25° C.

The polyarylethersulfones of this invention are prepared by reacting the monomers represented by the following formulae:

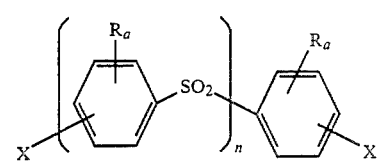 (IV)

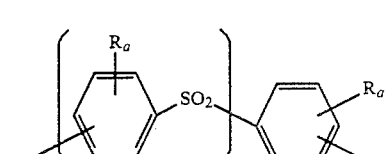 (V)

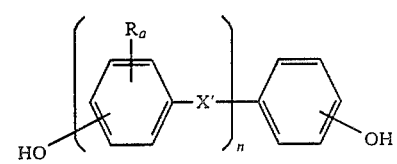 (VI)

and/or

-continued

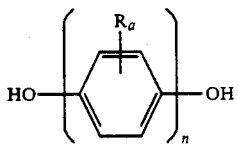
(VII)

wherein R, a, X' and n are as previously defined, and X and Y are independently selected from Cl, Br, F, $NO_2$ or OH and at least 50 percent of the Y's are OH.

The ratio of the concentration of OH groups to Cl, Br, F and/or $NO_2$ groups used to form the polyarylethersulfone is from about 0.90 to about 1.10, preferably from about 0.98 to about 1.02.

The monomers, represented by formulas (IV), (V), (VI) and (VII), include the following:
2,2-bis(4-hydroxyphenyl)propane,
bis(4-hydroxyphenyl)methane,
4,4'-dihydroxydiphenyl sulfide,
4,4'-dihydroxydiphenyl ether,
4,4'-dihydroxydiphenyl sulfone,
2,4'-dihydroxydiphenyl sulfone,
4,4'-dichlorodiphenyl sulfone,
4,4'-dinitrodiphenyl sulfone,
4-chloro-4'-hydroxydiphenyl sulfone,
4,4'-biphenol, hydroquinone, and the like.

The preferred monomers include hydroquinone, 4,4-biphenol, 2,2-bis(4-hydroxyphenyl) propane, 4,4'-dichlorodiphenyl sulfone, and 4,4'-dihydroxydiphenyl sulfone or 4 chloro-4'-hydroxydiphenyl sulfone.

The polymers are prepared by contacting substantially equimolar amounts of the hydroxy containing compounds (depicted in formulas (IV) to (VII) supra) and halo and/or nitro containing compounds (depicted in formula (IV) and (V) supra) with from about 0.5 to about 1.0 mole of an alkali metal carbonate per mole of hydroxyl group in a solvent mixture comprising a solvent which forms an azeotrope with water in order to maintain the reaction medium at substantially anhydrous conditions during the polymerization.

The temperature of the reaction mixture is kept at from about 120° to about 180° C., for about 1 to about 5 hours and then raised and kept at from about 200° to about 250° C., preferably from about 210° to about 230° C., for about 1 to 10 hours.

The reaction is carried out in an inert atmosphere, e.g., nitrogen, at atmospheric pressure, although higher or lower pressures may also be used.

The polyarylethersulfone is then recovered by conventional techniques such as coagulation, solvent evaporation, and the like.

The solvent mixture comprises a solvent which forms an azeotrope with water and a polar aprotic solvent. The solvent which forms an azeotrope with water includes an aromatic hydrocarbon such as benzene, toluene, xylene, ethylbenzene, chlorobenzene, and the like.

The polar aprotic solvents employed in this invention are those generally known in the art for the manufacture of polyarylether sulfones and include sulfur containing solvents such as those of the formula:

in which each $R_5$ represents a monovalent lower hydrocarbon group free of aliphatic unsaturation, which preferably contains less than about 8 carbon atoms or when connected together represents a divalent alkylene group with b being an integer from 1 to 2 inclusive. Thus, in all of these solvents all oxygens and two carbon atoms are bonded to the sulfur atom. Contemplated for use in this invention are such solvents as those having the formula:

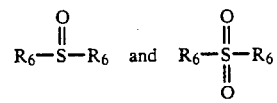

where the $R_6$ groups are independently lower alkyl, such as methyl, ethyl, propyl, butyl, and like groups, and aryl groups such as phenyl and alkylphenyl groups such as the tolyl group, as well as those where the $R_6$ groups are interconnected as in a divalent alkylene bridge such as:

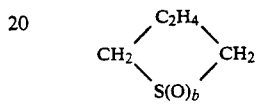

in tetrahydrothiophene oxides and dioxides. Specifically, these solvents include dimethylsulfoxide, dimethylsulfone, diphenylsulfone, diethylsulfoxide, diethylsulfone, diisopropylsulfone, tetrahydrothiophene 1,1-dioxide (commonly called tetramethylene sulfone or sulfolane) and tetrahydrothiophene-1 monoxide.

Additionally, nitrogen containing solvents may be used. These include dimethyl acetamide, dimethyl formamide and N-methylpyrolidone.

The azeotrope forming solvent and polar aprotic solvent are used in a weight ratio of from about 10:1 to about 1:1, preferably from about 7:1 to about 5:1.

In the reaction, the hydroxy containing compound is slowly converted, in situ, to the alkali salt thereof by reacting with the alkali metal carbonate. The alkali metal carbonate is preferably potassium carbonate. Mixtures of carbonates such as potassium and sodium carbonate may also be used.

Water is continuously removed from the reaction mass as an azeotrope with the azeotrope forming solvent so that substantially anhydrous conditions are maintained during the polymerization.

It is essential that the reaction medium be maintained substantially anhydrous during the polycondensation. While amounts of water up to about one percent can be tolerated, and are somewhat beneficial when employed with fluorinated dihalobenzenoid compounds, amounts of water substantially greater than this are desirably avoided as the reaction of water with the halo and/or nitro compound leads to formation of phenolic species and only low molecular weight products are secured. Consequently, in order to secure the high polymers, the system should be substantially anhydrous, and preferably contain less than 0.5 percent by weight water during the reaction.

Preferably, after the desired molecular weight has been attained, the polymer is treated with an activated aromatic halide or an aliphatic halide such as methyl chloride or benzyl chloride, and the like. Such treatment of the polymer converts the terminal hydroxyl groups into ether groups which stabilize the polymer. The polymer so treated has good melt and oxidative stability.

B. POLYARYLETHER RESIN

The poly(aryl ether) resin suitable for blending with the polyarylethersulfone, is different from the polyarylethersulfone and is a linear, thermoplastic polyarylene polyether containing recurring units of the following formula:

—O—E—O—E'— wherein E is the residuum of a dihydric phenol, and E' is the residuum of a benzenoid compound having an inert electron withdrawing group in at least one of the positions ortho and para to the valence bonds; both of said residua are valently bonded to the ether oxygens through aromatic carbon atoms. Such aromatic polyethers are included within the class of polyarylene polyester resins described in, for example, U.S. Pat. Nos. 3,264,536 and 4,175,175. It is preferred that the dihydric phenol be a weakly acidic dinuclear phenol such as, for example, the dihydroxyl diphenyl alkanes or the nuclear halogenated derivatives thereof, such as, for example, the 2,2-bis(4-hydroxyphenyl)propane, 1,1-bis(4-hydroxphenyl)2-phenyl ethane, bis(4-hydroxyphenyl)methane, or their chlorinated derivatives containing one or two chlorines on each aromatic ring. Other materials also termed appropriately bisphenols are also highly valuable and preferred. These materials are the bisphenols of a symmetrical or unsymmetrical joining group, as, for example, ether oxygen (—O—),

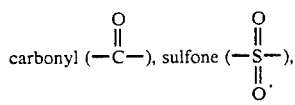

carbonyl (—C—), sulfone (—S—), or hydrocarbon residue in which the two phenolic nuclei are joined to the same or different carbon atoms of the residue.

Such dinuclear phenols can be characterized as having the structure:

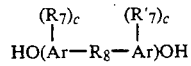

HO(Ar—R$_8$—Ar)OH wherein Ar is an aromatic group and preferably is a phenylene group, R$_7$ and R'$_7$ can be the same or different inert substituent groups such as alkyl groups having from 1 to 4 carbons atoms, aryl, halogen atoms, i.e., fluorine, chlorine, bromine or iodine, or alkoxyl radicals having from 1 to 4 carbon atoms, the c's are independently integers having a value of from 0 to 4, inclusive, and R$_8$ is representative of a bond between aromatic carbon atoms as in dihydroxyl-diphenyl, or is a divalent radical, including for example, radicals such as

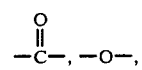

—C—, —O—,

—S—, —SO—, —S—S—, —SO$_2$—, and divalent hydrocarbon radicals such as alkylene, alkylidene, cycloalkylene, cycloalkylidene, or the halogen, alkyl, aryl or like substituted alkylene, alkylidene and cycloaliphatic radicals as well as aromatic radicals and rings fused to both Ar groups.

Examples of specific dihydric polynuclear phenols including among others:

the bis-(hydroxyphenyl) alkanes such as 2,2-bis-(4-hydroxyphenyl)propane, 2,4'-dihydroxydiphenylmethane, bis-(2-hydroxyphenyl)methane, bis-(4-hydroxyphenyl)methane, bis(4-hydroxy-2,6-dimethyl-3-methoxyphenyl)methane, 1,1-bis-(4-hydroxy-phenyl)ethane, 1,2-bis-(4-hydroxyphenyl)ethane, 1,1-bis-(4-hydroxy-2-chlorophenyl)ethane, 1,1-bis-(3-methyl-4-hydroxyphenyl)propane, 1,3-bis-(3-methyl-4-hydroxyphenyl)propane, 2,2-bis-(3-phenyl-4-hydroxyphenyl)propane, 2,2-bis-(3-isopropyl-4-hydroxyphenyl)propane, 2,2-bis-(2-isopropyl-4-hydroxyphenyl)propane, 2,2-bis-(4-hydroxy-naphthyl)propane, 2,2-bis-(4-hydroxyphenyl)pentane, 3,3-bis-(4-hydroxyphenyl)pentane, 2,2-bis-(4-hydroxyphenyl)heptane, bis-(4-hydroxyphenyl)phenylmethane, 2,2-bis-(4-hydroxyphenyl)-1-phenyl-propane, 2,2-bis-(4-hydroxyphenyl)1,1,1,3,3,3, -hexafluoropropane, and the like;

di(hydroxyphenyl)sulfones such as bis-(4-hydroxyphenyl)sulfone, 2,4'-dihydroxydiphenyl sulfone, 5-chloro-2,4'-dihydroxydiphenyl sulfone, 5'-chloro-4,4'-dihydroxydiphenyl sulfone, and the like;

di(hydroxyphenyl)ethers, such as bis-(4-hydroxyphenyl)ether, the 4,3'-, 4,2'-2,2'-2,3-, dihydroxyphenyl ethers, 4,4'-dihydroxyl-2,6-dimethyldiphenyl ether, bis-(4-hydroxy-3-isobutylphenyl)ether, bis-(4-hydroxy-3-isopropylphenyl)ether, bis-(4-hydroxy-3-chlorophenyl)ether, bis-(4-hydroxy-3-fluorophenyl)ether, bis-(4-hydroxy-3-bromophenyl)ether, bis-(4-hydroxynaphthyl)ether, bis-(4-hydroxy-3-chloronaphthyl)ether, and 4,4'-dihydroxyl-3,6-dimethoxydiphenyl ether.

As herein used the E' term defined as being the "residuum of the dihydric phenol" of course refers to the residue of the dihydric phenol after the removal of the two aromatic hydroxyl groups. Thus as is readily seen these polyarylene polyethers contain recurring groups of the residuum of the dihydric phenol and the residuum of the benzenoid compound bonded through aromatic ether oxygen atom.

Any dihalobenzenoid or dinitrobenzenoid compound or mixtures thereof can be employed in this invention which compound or compounds has the two halogens or nitro-groups bonded to benzene rings having an electron withdrawing group in at least one of the positions ortho and para to the halogen or nitro group. The dihalobenzenoid or dinitrobenzenoid compound can be either mononuclear where the halogens or nitro groups are attached to the same benzenoid rings or polynuclear where they are attached to different benzenoid rings, as long as there is an activating electron withdrawing group in the ortho or para position of that benzenoid nuclear. Fluorine and chlorine substituted benzenoid reactants are preferred; the fluorine compounds for fast reactivity and the chlorine compounds for their inexpensiveness. Fluorine substituted benzenoid compounds are most preferred, particularly when there is a trace of water present in the polymerization reaction system. However, this water content should be maintained below about 1% and preferably below 0.5% for best results.

An electron withdrawing group can be employed as the activator group in these compounds. It should be, of course, inert under the reaction conditions, but otherwise its structure is not critical. Preferred are the strong activating groups such as the sulfone group

bonding two halogen or nitro substituted benzenoid nuclei as in the 4,4'-dichlorodiphenyl sulfone and 4,4'-difluorodiphenyl sulfone, although such other strong withdrawing groups hereinafter mentioned can also be used with equal ease.

The more powerful of the electron withdrawing groups give the fastest reactions and hence are preferred. It is further preferred that the ring contain no electron supplying groups on the same benzenoid nucleus as the halogen or nitro group; however, the presence of other groups on the nucleus or in the residuum of the compound can be tolerated.

The activating group can be basically either of two types:

(a) monovalent groups that activate one or more halogens or nitro-groups on the same ring such as another nitro or halo group, phenylsulfone, or alkylsulfone, cyano, trifluoromethyl, nitroso, and hetero nitrogen, as in pyridine.

(b) divalent groups which can activate displacement of halogens on two different rings, such as the sulfone group

the carbonyl group

the vinylene group

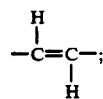

the sulfoxide group

the azo group —N=N—; the saturated fluorocarbon groups

—CF$_2$—CF$_2$CF$_2$—; organic phosphine oxides

where R$_9$ is a hydrocarbon group, and the ethylidene group

where A can be hydrogen or halogen.

If desired, the polymers may be made with mixtures of two or more dihalobenzenoid or dinitrobenzenoid compounds. Thus, the E' residuum of the benzenoid compounds in the polymer structure may be the same or different.

It is seen also that as used herein, the E' term defined as being the "residuum of the benzenoid compound" refers to the aromatic or benzenoid residue of the compound after the removal of the halogen atom or nitro group on the benzenoid nucleus.

The polyarylene polyethers of this invention are prepared by methods well known in the art as for instance the substantially equimolar one-step reaction of a double alkali metal salt of dihydric phenol with a dihalobenzenoid compound in the presence of specific liquid organic sulfoxide or sulfone solvents under substantially anhydrous conditions. Catalysts are not necessary for this reaction.

The polymers may also be prepared in a two-step process in which a dihydric phenol is first converted in situ in the primary reaction solvent to the alkali metal salt of the reaction with the alkali metal, the alkali metal hydride, alkali metal hydroxide, alkali metal alkoxide or the alkali metal alkyl compounds. Preferably, the alkali metal hydroxide is employed. After removing the water which is present or formed, in order to secure substantially anhydrous conditions, the dialkali metal salts of the dihydric phenol are admixed and reacted with about stoichiometric quantities of the dihalobenzenoid or dinitrobenzenoid compound.

Additionally, the polyethers may be prepared by the procedure described in, for example, U.S. Pat. No. 4,176,222 in which a substantially equimolar mixture of at least one bisphenol and at least one dihalobenzenoid are heated at a temperature of from about 100° to about 400° C. with a mixture of sodium carbonate or bicarbonate and a second alkali metal carbonate or bicarbonate having a higher atomic number than that of sodium.

Further, the polyethers may be prepared by the procedure described in Canadian Patent 847,963 wherein the bisphenol and dihalobenzenoid compound are heated in the presence of potassium carbonate using a high boiling solvent such as diphenylsulfone.

Preferred polyarylene polyethers of this invention are those prepared using the dihydric polynuclear phenols of the following four types, including the derivatives thereof which are substituted with inert substituent groups

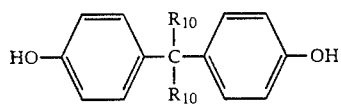
(a)

in which the $R_{10}$ groups represent independently hydrogen, lower alkyl, aryl and the halogen substituted groups thereof, which can be the same or different;

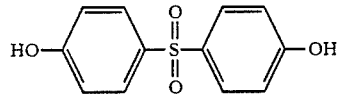
(b)

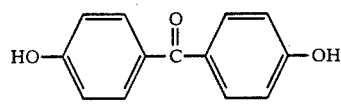
(c)

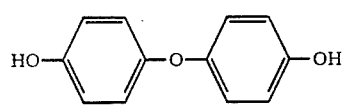
(d)

and substituted derivatives thereof.

It is also contemplated in this invention to use a mixture of two or more different dihydric phenols to accomplish the same ends as above. Thus when referred to above the —E— residuum in the polymer structure can actually be the same or different aromatic residua.

The poly(aryl ether)s have a reduced viscosity of from about 0.35 to about 1.5 as measured in an appropriate solvent at an appropriate temperature depending on the particular polyether, such as in methylene chloride at 25° C.

The preferred poly(aryl ether)s have repeating units of the formula:

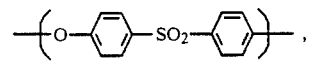

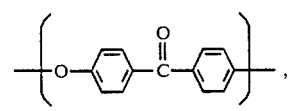

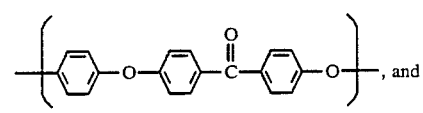, and

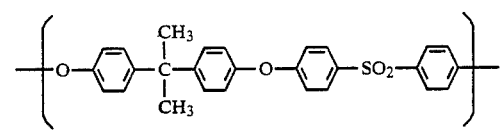

C. POLYARYLATES

The polyarylates which are suitable for use in this invention are derived from a dihydric phenol and at least one aromatic dicarboxylic acid and have a reduced viscosity of from about 0.4 to greater than about 1.0, preferably from about 0.6 to about 0.8 dl/gm, as measured in chloroform (0.5 g/100 ml chloroform) or other suitable solvent at 25° C.

A particularly desirable dihydric phenol is of the following formula:

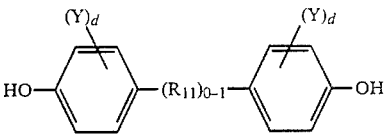

wherein Y is independently selected from, hydrogen, alkyl groups of 1 to 4 carbon atoms, chlorine or bromine, each d, independently, has a value of from 0 to 4, inclusive, and $R_{11}$ is a divalent saturated or unsaturated aliphatic hydrocarbon radical, particularly an alkylene or alkylidene radical having from 1 to 6 carbon atoms, or a cycloalkylidene or cycloalkylene radicals having up to and including 9 carbon atoms, O, CO, $SO_2$, or S. The dihydric phenols may be used individually or in combination.

The dihydric phenols that may be used in this invention include the following:
2,2-bis-4(4-hydroxyphenyl)propane;
bis-(2-hydroxyphenyl)methane,
bis-(4-hydroxyphenyl)methane,
bis-(4-hydroxy-2,6-dimethyl-3-methoxyphenyl) methane,
1,1-bis-(4-hydroxyphenyl)ethane,
1,2-bis-(4-hydroxyphenyl)ethane,
1,1-bis-(4-hydroxy-2-chlorophenyl)ethane,
1,3-bis-(3-methyl-4-hydroxyphenyl)ethane,
1,3-bis-(3-methyl-4-hydroxyphenyl)propane,
2,2-bis-(3-phenyl-4-hydroxyphenyl)propane,
2,2-bis-(3-isopropyl-4-hydroxyphenyl)propane,
2,2-bis-(2-isopropyl-4-hydroxyphenyl)propane,
2,2-bis-(4-hydroxyphenyl)pentane,
3,3-bis-(4-hydroxyphenyl)pentane,
2,2-bis-(4-hydroxyphenyl)heptane,
1,2-bis-(4-hydroxyphenyl)1,2-bis-(phenyl)-propane,
4,4'-(dihydroxyphenyl)ether,
4,4'-(dihydroxyphenyl)sulfide,
4,4'-(dihydroxyphenyl)sulfone,
4,4'-(dihydroxyphenyl)sulfoxide,
4,4'-(dihydroxybenzophenone), and
naphthalene diols The aromatic dicarboxylic acids that may be used in this invention include terephthalic acid, isophthalic acid, any of the naphthalene dicarboxylic acids and mixtures thereof, as well as alkyl substituted homologs of these carboxylic acids, wherein the alkyl group contains from 1 to about 4 carbon atoms, and acids containing other inert substituents, such as halides, alkyl or aryl ethers, and the like. Acetoxybenzoic acid can also be used. Preferably, mixtures of isophthalic and terephthalic acids are used. The isophthalic acid to terephthalic acid ratio in the mixture is about 0:100 to about 100:0, while the most preferred acid ratio is about 75:25 to about 50:50. Also, from about 0.5 to about 20 percent of aliphatic diacids containing from 2 to about 10 carbon atoms, such as adipic acid, sebacic acid, and the like may be additionally used in the polymerization reaction.

The polyarylates can be prepared by any of the well known prior art polyester forming reactions, such as the reaction of the acid chlorides of the aromatic dicarboxylic acids with the dihydric phenols; the reaction of the diaryl esters of the aromatic dicarboxylic acids with the dihydric phenols; or the reaction of the aromatic diacids with diester derivatives of the dihydric phenol. These processes are described in, for example, U.S. Pat. Nos. 3,317,464; 3,948,856; 3,780,148; 3,824,213; and 3,133,898.

The polyarylates are preferably prepared by the process as set forth in U.S. Pat. No. 4,321,355. This process comprises the following steps:

(a) reacting an acid anhydride derived from an acid containing from 2 to 8 carbon atoms with at least one dihydric phenol to form the corresponding diester; and (b) reacting said diester with at least one aromatic dicarboxylic acid at a temperature sufficient to form the polyarylate, wherein the improvement comprises removing residual acid anhydride after formation of the dihydric phenol diester so that its concentration is less than about 1500 parts per million.

The acid anhydride suitable is derived from an acid containing from 2 to 8 carbon atoms. The preferred acid anhydride is acetic anhydride.

The dihydric phenol is described above.

Generally, the dihydric phenol reacts with the acid anhydride under conventional esterification conditions to form the dihydric phenol diester. The reaction may take place in the presence or absence of a solvent. Additionally, the reaction may be conducted in the presence of a conventional esterification catalyst or in the absence thereof.

D. POLYETHERIMIDES

The polyetherimides suitable for use in this invention are well known in the art and are described in, for example, U.S. Pat. Nos. 3,847,867, 3,838,097 and 4,107,147.

The polyetherimides are of the following formula:

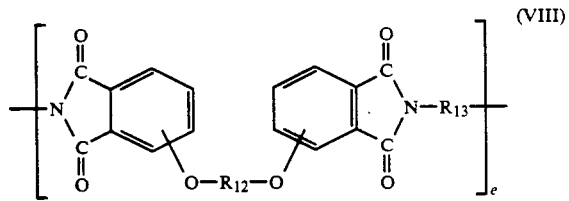
(VIII)

wherein e is an integer greater than 1, preferably from about 10 to about 10,000 or more, —O—$R_{12}$—O— is attached to the 3 or 4 and 3' or 4' positions and $R_{12}$ is selected from (a) a substituted or unsubstituted aromatic radical such as

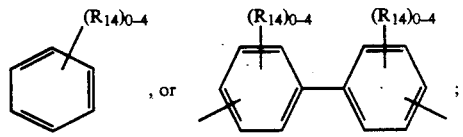

(b) a divalent radical of the formula:

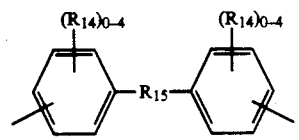

wherein $R_{14}$ is independently $C_1$ to $C_6$ alkyl, aryl or halogen and $R_{15}$ is selected from —O—, —S—,

—$SO_2$—, —SO—, alkylene of 1 to 6 carbon atoms, cycloalkylene of 4 to 8 carbon atoms, alkylidene of 1 to 6 carbon atoms or cycloalkylidene of 4 to 8 carbon atoms, $R_{13}$ is selected from an aromatic hydrocarbon radical having from 6 to 20 carbon atoms and halogenated derivatives thereof, or alkyl substituted derivatives thereof, wherein the alkyl group contains 1 to 6 carbon atoms, alkylene and cycloalkylene radicals having from 2 to 20 carbon atoms and $C_2$ to $C_8$ alkylene terminated polydiorganosiloxane or a divalent radical of the formula

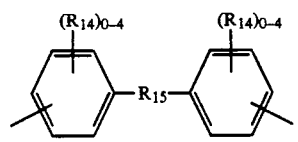

wherein $R_{14}$ and $R_{15}$ are as previously defined.

The polyetherimides may also be of the following formula:

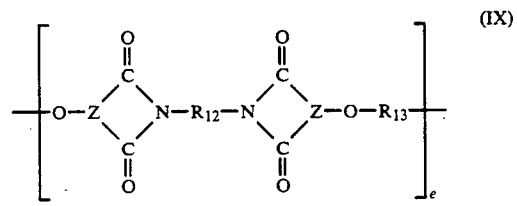
(IX)

wherein —O—Z is a member selected from

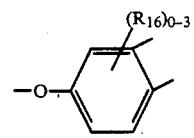

wherein $R_{16}$ is independently hydrogen, lower alkyl or lower alkoxy

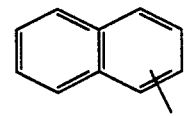

and,

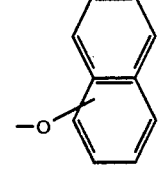

wherein the oxygen may be attached to either ring and located ortho or para to one of the bonds of the imide carbonyl groups, $R_{12}$ and $R_{13}$ and e are as previously defined.

These polyetherimides are prepared by methods well known in the art as set forth in, for example, U.S. Pat.

Nos. 3,833,544, 3,887,588, 4,017,511, 3,965,125 and 4,024,110.

The polyethermides of Formula (VIII) can, for example, be obtained by any of the methods well-known to those skilled in the art including the reaction of any aromatic bis(ether anhydride)s of the formula

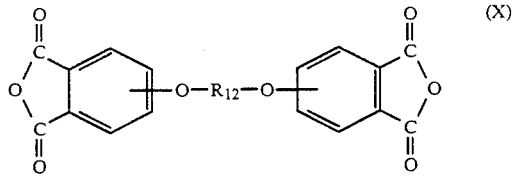

where $R_{12}$ is as defined hereinbefore, with a diamino compound of the formula $$H_2N-R_{13}-NH_2 \qquad (XI)$$

where $R_{13}$ is as defined hereinbefore. In general, the reactions can be advantageously carried out employing well-known solvents, e.g., o-dichlorobenzene, m-cresol/toluene, N,N-dimethylacetamide, etc., in which to effect interaction between the dianhydrides and diamines, at temperatures of from about 20° to about 250° C. Alternatively, the polyetherimides can be prepared by melt polymerization of any dianhydrides of Formula (X) with any diamino compound of Formula (XI) while heating the mixture of the ingredients at elevated temperatures with concurrent intermixing. Generally, melt polymerization temperatures between about 200° to 400° C. and preferably 230° to 300° C. can be employed. Any order of addition of chain stoppers ordinarily employed in melt polymerizations can be employed. The conditions of the reaction and the proportions of ingredients can be varied widely depending on the desired molecular weight, intrinsic viscosity, and solvent resistance. In general, equimolar amounts of diamine and dianhydride are employed for high molecular weight polyetherimides, however, in certain instances, a slight molar excess (about 1 to 5 mole percent) of diamine can be employed resulting in the production of polyetherimides of Formula I have an intrinsic viscosity $\eta$ greater than 0.2 deciliters per gram, preferably 0.35 to 0.60, or 0.7 deciliters per gram or even higher when measured in m-cresol at 25° C.

The aromatic bis(ether anhydride)s of Formula (X) include, for example,
  2,2-bis[4-(2,3-dicarboxyphenoxy)phenyl]propane dianhydride;
  4,4'-bis(2,3-dicarboxyphenoxy)diphenyl ether dianhydride;
  1,3-bis(2,3-dicarboxyphenoxy)benzene dianhydride;
  4,4'-bis(2,3-dicarboxyphenoxy)diphenyl sulfide dianhydride;
  1,4-bis(2,3-dicarboxyphenoxy)benzene dianhydride;
  4,4'-bis(2,3-dicarboxyphenoxy)benzophenone dianhydride;
  4,4'-bis(2,3-dicarboxyphenoxy)diphenyl sulfone dianhydride;
  2,2-bis[4-(3,4-dicarboxyphenoxy)phenyl]propane dianhydride;
  4,4'-bis(3,4-dicarboxyphenoxy)diphenyl ether dianhydride;
  4,4'-bis(3,4-dicarboxyphenoxy)diphenyl sulfide dianhydride;
  4,3-bis(3,4-dicarboxyphenoxy)benzene dianhydride;
  1,4-bis(3,4-dicarboxyphenoxy)benzene dianhydride;
  4,4'-bis(3,4-dicarboxyphenoxy)benzophenone dianhydride;
  4-(2,3-dicarboxyphenoxy)-4'-(3,4-dicarboxyphenoxy)diphenyl-2,2-propane dianhydride; etc. and mixtures of such dianhydrides.

The organic diamines of Formula (XI) include, for example, m-phenylenediamine, p-phenylenediamine, 2,2-bis(p-aminophenyl)propane, 4,4'-diaminodiphenylmethane, 4,4'-diaminodiphenyl sulfide, 4,4'-diaminodiphenyl sulfone, 4,4'-diaminodiphenyl ether, 1,5-diaminonaphthalene, 3,3'-dimethylbenzidine, 3,3'-dimethoxybenzidine, The polyetherimides of formula (X) may, for example, be prepared by effecting reaction in the presence of a dipolar aprotic solvent of a mixture of ingredients comprising, for instance, (1) a bis(nitrophthalimide) of the general formula:

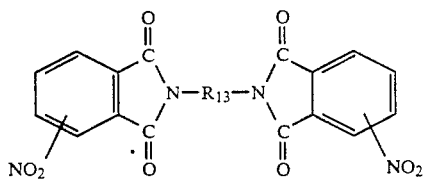

wherein $R_{13}$ is defined as hereinabove, and (2) an alkali metal salt of an organic compound of the general formula:

$$MO-R_{12}-OM \qquad (XIII)$$

wherein M is an alkali metal and $R_{12}$ is defined as hereinabove.

The bis(nitrophthalimide) used in preparing the polymer is formed by reacting a diamine of the formula described above, $NH_2-R_{13}-NH_2$, with a nitro-substituted aromatic anhydride of the formula:

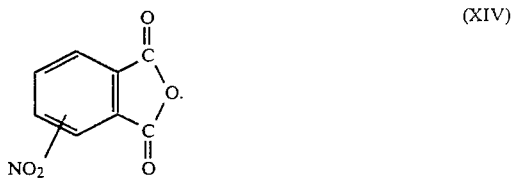

The molar ratio of diamine to anhydride should ideally be about 1:2 respectively. The initial reaction product is a bis(amide-acid) which is subsequently dehydrated to the corresponding bis(nitrophthalimide).

The diamines are described, supra.

The preferred nitrophthalic anhydrides useful in the present invention are 3-nitrophthalic anhydride, 4-nitrophthalic anhydride and mixtures thereof. These reactants are commercially available in reagent grade. They may also be prepared by the nitration of phthalic anhydride using procedures described in Organic Syntheses, Collective Vol. I, Wiley (1948), page 408. Certain other closely related nitroaromatic anhydrides may also be used in the reaction and are illustrated for example by 2-nitronaphthalic anhydride, 1-nitro-2,3-naphthalenedicarboxylic anhydride and 3-methoxy-6-nitrophthalic anhydride, and the like.

With reference to the alkali metal salts of formula (XIII) among the divalent carbocyclic aromatic radicals which $R_{12}$ may represent (mixtures of such radicals are also included) are, for instance, divalent aromatic hydrocarbon radicals of from 6 to 20 carbon atoms, such as phenylene, biphenylene, naphthylene, etc. Included are residues of, e.g. hydroquinone, resorcinol, chlorohydroquinone, etc. In addition, $R_{12}$ may be a residue of a dihydroxyl diarylene compound in which the aryl nuclei are joined by either an aliphatic group, a sulfoxide group, sulfonyl group, sulfur, carbonyl group, oxygen, etc. Typical of such diarylene compounds are the following:

2,4-dihydroxydiphenylmethane;
bis(2-hydroxyphenyl)methane;
2,2-bis(4-hydroxyphenyl)propane;
bis(4-hydroxyphenyl)methane;
bis(4-hydroxy-5-nitrophenyl)methane;
bis(4-hydroxy-2,6-dimethyl-3-methoxyphenyl)methane;
1,1-bis(4-hydroxyphenyl)ethane;
1,2-bis(4-hydroxyphenyl)ethane;
1,1-bis(4-hydroxy-2-chlorophenyl)ethane;
1,1-bis(2,5-dimethyl-4-hydroxyphenyl)ethane;
1,3-bis(3-methyl-4-hydroxyphenyl)propane;
2,2-bis(3-phenyl-4-hydroxyphenyl)propane;
2,2-bis(3-isopropyl-4-hydroxyphenyl)propane;
2,2-bis(4-hydroxynaphthyl)propane;
hydroquinone;
naphthalene diols;
bis(4-hydroxyphenyl)ether;
bis(4-hydroxyphenyl)sulfide;
bis(4-hydroxyphenyl)sulfone; and the like.

When dialkali metal salts of formula (XIII) are used with the compound illustrated by formula (XII), the ingredients are advantageously present in an equal molar ratio for optimum molecular weight and properties of the polymer. Slight molar excesses, e.g., about 0.001 to 0.10 molar excess of either the dinitro-substituted organic compound or of the dialkali metal salt of formula (XIII) may be employed. When the molar ratios are approximately equal, the polymer is substantially terminated by a=Z—NO$_2$ at one end and a phenolic group at the other end. If there is a molar excess of one compound, that particular terminal group will predominate.

The conditions of reaction whereby the alkali-metal salt of formula (XIII) is reacted with the dinitro-substituted organic compound of formula (XII) can be varied widely. Generally, temperatures of the order of about 25° to about 150° C. are advantageously employed, although it is possible to employ lower or higher temperature conditions depending on the ingredients used, the reaction product sought, time of reaction, solvent employed, etc. In addition to atmospheric pressure, superatmospheric pressures and subatmospheric pressures may be employed depending upon the other conditions of reaction, the ingredients used, the speed at which it is desired to effect reaction, etc.

The time of reaction also can be varied widely depending on the ingredients used, the temperature, the desired yield, etc. It has been found that times varying from about 5 minutes to as much as 30 to 40 hours are advantageously employed to obtain the maximum yield and desired molecular weight. Thereafter the reaction product can be treated in the appropriate manner required to effect precipitation and/or separation of the desired polymeric reaction product. Generally, common solvents such as alcohols (e.g. methanol, ethanol, isopropyl alcohol, etc.) and aliphatic hydrocarbons (e.g. pentane, hexane, octane, cyclohexane, etc.) may be employed as precipitants for this purpose.

It is important that the reaction between the dinitro-substituted organic compound of formula V and the alkali-metal salt of formula VI (mixtures of such alkali-metal salts can also be used) be carried out in the presence of a dipolar aprotic solvent.

The polymerization is performed under anhydrous conditions usually using dipolar aprotic solvents such as dimethylsulfoxide which are added in varying amounts depending upon the particular polymerization. A total quantity of solvent, dipolar aprotic solvent or mixture of such solvent with an aromatic solvent sufficient to give a final solution containing 10 to 20% by weight of polymer is preferably employed.

The preferred polyetherimides include those having repeating units of the following formula:

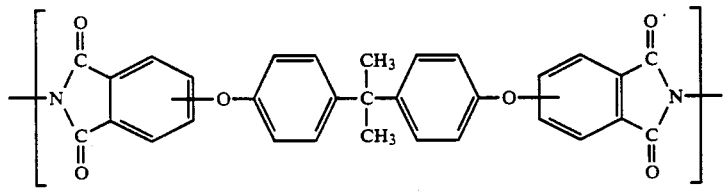

THE CRYSTALLINE POLYMERS

A. Polyesters

The polyesters which are suitable for use herein are derived from an aliphatic or cyloaliphatic diol, or mixtures thereof, containing from 2 to about 10 carbon atoms and at least one aromatic dicarboxylic acid. The polyesters which are derived from an aliphatic diol and an aromatic dicarboxylic acid have repeating units of the following general formula:

$$\left\{ O-(CH_2)_n OC-\underset{\substack{\| \\ O}}{}\underset{}{\bigcirc}-\underset{\substack{\| \\ O}}{C} \right\} \quad XV$$

wherein n is an integer of from 2 to 10.

Preferred polyesters include poly(ethylene terephthalate) and poly(butylene terephthalate).

Also contemplated herein are the above polyesters with minor amounts, e.g., from 0.5 to about 2 percent by weight, of units derived from aliphatic acids and/or aliphatic polyols, to form copolyesters. The aliphatic polyols include glycols, such as poly(ethylene glycol). These can be made following the teachings of, for example, U.S. Pat. Nos. 2,465,319 and 3,047,539.

The polyesters which are derived from a cycloaliphatic diol and an aromatic dicarboxylic acid are prepared by condensing either the cis - or trans-isomer (or mixtures thereof) of, for example, 1,4-cyclohexanedimethanol with an aromatic dicarboxylic acid so as to produce a polyester having recurring units of the following formula:

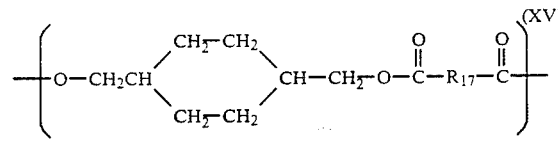

wherein the cyclohexane ring is selected from the cis - and trans- isomers thereof and $R_{17}$ represents an aryl radical containing 6 to 20 carbon atoms and which is the decarboxylated residue derived from an aromatic dicarboxylic acid.

Examples of aromatic dicarboxylic acids indicated by $R_{17}$ in formula IX, are isophthalic or terephthalic acid, 1,2-di(p-carboxyphenyl)ethane, 4,4'-dicarboxydiphenyl ether, etc., and mixtures of these. All of these acids contain at least one aromatic nucleus. Fused rings can also be present, such as in 1,4-or 1,5-naphthalenedicarboxylic acids. The preferred dicarboxylic acids are terephthalic acid or a mixture of terephthalic and isophthalic acids.

A preferred polyester may be derived from the reaction of either the cis -or trans-isomer (or a mixture thereof) of 1,4-cyclohexanedimethanol with a mixture of isophthalic and terephthalic acids. These polyesters have repeating units of the formula:

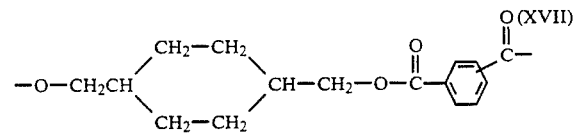

Another preferred polyester is a copolyester derived from a cyclohexane dimethanol, an alkylene glycol and an aromatic dicarboxylic acid. These copolyesters are prepared by condensing either the cis - or trans-isomer (or mixtures thereof) of, for example, 1,4-cyclohexanedimethanol and an alkylene glycol with an aromatic dicarboxylic acid so as to produce a copolyester having repeating units of the following formula:

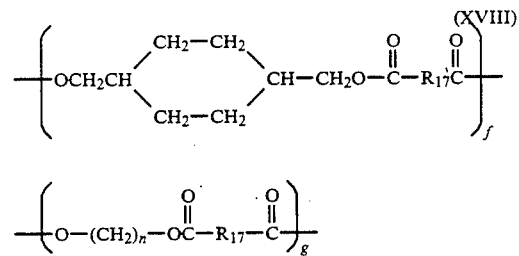

wherein the cyclohexane ring is selected from the cis - and trans- isomers thereof, $R_{17}$ is as previously defined, n is an integer of 2 to 10, the f units comprise from about 10 to about 90 percent by weight and the g units comprise from about 10 to about 90 percent by weight.

The preferred copolyester may be derived from the reaction of either the cis - or trans-isomer (or mixtures thereof) of 1,4-cyclohexanedimethanol and ethylene glycol with terephthalic acid in a molar ratio of 1:2:3. These copolyesters have repeating units of the following formula:

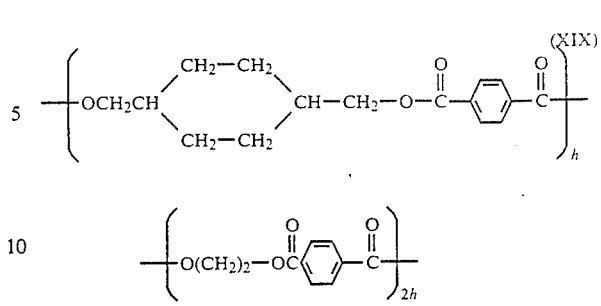

wherein h can be 10 to 10,000. Block as well as random copolymers are possible.

The polyester as described herein are either commercially available or can be produced by methods well known in the art, such as those set forth in, for example, U.S. Pat. No. 2,901,466.

The polyesters used herein have an intrinsic viscosity of from about 0.4 to about 2.0 dl/g. as measured in a 60:40 phenol/tetrachloroethane mixture or similar solvent at 23° to 30° C.

B. POLY(ARYLENE SULFIDE)

The poly(arylene sulfide)s which are suitable for use herein are solid, have a melting point of at least about 150° F. and are insoluble in common solvents. Such resins can be conveniently prepared by the process disclosed in, for example, U.S. Pat. No. 3,354,129. Briefly, the process comprises the reaction of an alkali metal sulfide and a polyhalo ring-substituted aromatic compound in the presence of a suitable polar organic compound, as for example, the reaction of sodium sulfide with dichlorobenzene in the presence of N-methyl-2-pyrrolidone to form poly(phenylenesulfide).

The resulting polymer contains the aromatic nucleus of the polyhalo-substituted monomer coupled in repeating units predominantly through a sulfur atom. The polymers which are preferred for use according to this invention are those polymers having the repeating unit —$R_{23}$—S— where $R_{23}$ is phenylene, biphenylene, naphtylene, or a lower alkyl-substituted derivative thereof. By lower alkyl is meant alkyl groups having one to six carbon atoms such as methyl, propyl, isobutyl, n-hexyl and the like.

The preferred poly(arylene sulfide) is poly(phenylene sulfide), a crystalline polymer with a repeating structural unit comprising a para-substituted benzene ring and a sulfur atom which may be described by the following formula, where p has a value of at least about 50.

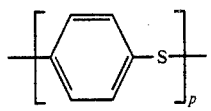

Suitable poly(phenylene sulfide) compositions are available commercially under the trade name Ryton of the Phillips Petroleum Company. Preferably, the poly(phenylene sulfide) component has a melt flow index, measured at 600° F. using a 5 Kg. weight and a standard orifice, within the range of from about 10 to about 7000 dg./min.

The term poly(arylene sulfide) is meant to include not only homopolymers but also arylene sulfide copolymers, terpolymers and the like.

C. Polyamides

The polyamide polymers which may be used herein are well known in the art. The polyamide polymers include homopolymers as well as copolymers. These polymers may be formed by conventional methods from the condensation of bifunctional monomers, by the condensation of diamines and dibasic acids, as well as by addition polymerization. Numerous combinations of diacids, such as carbonic acid, oxalic acid, glutaric acid, adipic acid, pimelic acid, suberic acid, azelaic acid, sebacic acid, dodecanedioic acid, isophthalic acid, terephthalic acid, and the like, diamines, such as hydrazine, ethylenediamine, hexamethylenediamine, 1,8-octanediamine, piperazine, and the like, and amino acids are possible. The chains between functional groups in the reactants may comprise linear or branched aliphatic hydrocarbons, or alicyclic or aromatic rings. They may also contain hetero atoms such as oxygen, sulfur, and nitrogen. Secondary diamines lead to the formation of N-substituted polyamides Also, included herein are the aromatic polyamide polymers which are aromatic in both the diamine and the dibasic acid. The dibasic acids include terephthalic acid, isophthalic acid, phthalic acid, and the like. The aromatic diamines include o-phenylenediamine, 2,4-diaminotoluene, 4,4'-methylenedianiline, and the like.

The polyamide polymers are prepared by methods well known in the art, such as by direct amidation which is the reaction of amine groups with carboxyls accompanied by elimination of water; low temperature polycondensation of diamines and diacid chlorides, ring-opening polymerization, addition of amines to activated double bonds, polymerization of isocyanates and reaction of formaldehyde with dinitriles.

The polyamide polymers include
polyhexamethylene-adipamide, i.e., nylon 6,6;
poly($\epsilon$-caprolactam), i.e., nylon-6;
polypropiolactam, i.e., nylon-3;
poly(pyrrolidin-2-one), i.e., nylon-4;
poly($\omega$-enanthamide), i.e., nylon-7;
polycapryllactam, i.e., nylon-8;
poly($\omega$-pelargonamide), i.e., nylon-9;
poly(11-aminodecanoic acid), i.e., nylon-10;
poly($\omega$-undecaneamide), i.e., nylon-11;
polyhexamethyleneterephthalamide, i.e., nylon-6,T, nylon 6,10, and the like

Other Additives

Other additives which may be used in combination with the thermoplastic polymers include mineral fillers such as carbonates including chalk, calcium carbonate, calcite and dolomite; silicates including mica, talc, wollastonite; silicon dioxide; glass spheres; glass powders; aluminum; clay; quartz; and the like. Additional additives include reinforcements such as glass fibers, carbon fibers, polyamides, silicon carbide, etc., pigments, such as titanium dioxide; thermal stabilizers such as zinc oxide; ultraviolet light stabilizers, plasticizers, and the like.

The mineral fillers and reinforcements may be used in amounts of up to about 40, preferably up to about 30 weight percent. The pigments are generally used in amounts of up to about 10 weight percent. The stabilizers are used in stabilizing amounts to stabilize the composition for the effect desired.

Additionally, nucleation additives such as sodium benzoate, various fillers, Cab-o-sil, and the like can be added to improve the crystallization rate so that injection molded articles will attain higher levels of crystallinity.

EXAMPLES

The following examples serve to give specific illustrations of the practice of this invention but they are not intended in any way to limit the scope of this invention.

The following designations used in the Examples have the following meaning:

Polyarylethersulfone: A polymer having the following repeating unit:

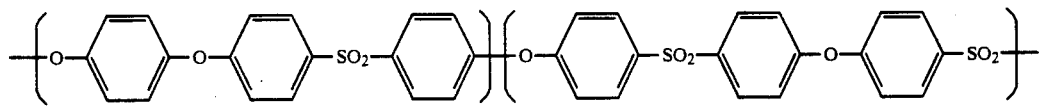

The polymer has a reduced viscosity of 0.61 dl/g as measured in N-methyl-pyrrolidinone (0.2 g/100 ml) at 25° C.

Polysulfone: A polymer having the following repeating unit:

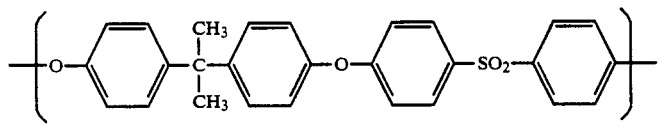

This polymer has a reduced viscosity of 0.47 dl/g as measured in chloroform (0.1 g/100 ml) at 25° C.

Polyarylate: A polymer having a repeat unit of formula:

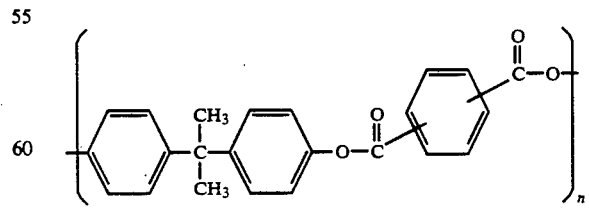

having a reduced viscosity of 0.66 as measured in p-chlorophenol, 0.2 g/100 ml at 49° C. (ARDEL® D-100 obtained from Union Carbide Corp.)

Polyetherimide: A polymer having a repeat unit of the formula:

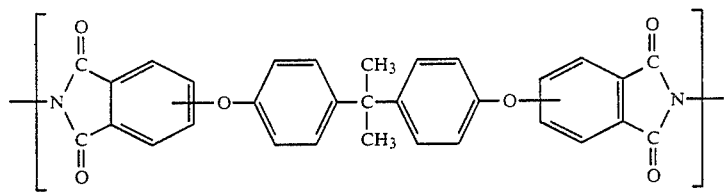

This polymer has a reduced viscosity of 0.51 as measured in chloroform (0.5 g. per 100 ml) at 25° C.

CONTROLS A AND B

Polyarylethersulfone and Polysulfone were injection molded into ⅛ inch thick tensile specimens on an Arburg reciprocating screw injecting molding machine at about 720° F., immersed in water for 16 hours, and completely submerged in molten solder at 420° F. for 60–120 seconds (simulation of VPS exposure). The latter represents a rigorous thermal exposure which resulted in bubbling, foaming, and distortion of the test specimens.

The test specimens were measured for the following properties: tensile modulus, tensile strength and percent elongation according to ASTM D-638, tensile impact according to ASTM D-1822; flexural strength and modulus according to ASTM D-638 and heat distortion temperature according to ASTM D-648.

TABLE I

| Test Property | Polyaryl-ethersulfone | Poly-sulfone |
|---|---|---|
| Tensile Strength (psi) | 12,000 | 10,200 |
| Tensile Modulus (psi) | 385,000 | 360,000 |
| % Elongation at Break | 40 | 50–100 |
| Flexural Strength (psi) | 16,100 | 15,400 |
| Flexural Modulus (psi) | 399,000 | 390,000 |
| HDT @ 264 psi (°C.) | 204° C. | 174° C. |

EXAMPLE 1

A poly(phenylene sulfide) resin (Ryton P-4, Phillips Chemical Co., Houston, TX) was placed in a pan to a depth of 2 inches. The pan was then placed in a circulating air oven at 240° C. for 17 hours for advancement. After advancing, the resin had a melt flow of 1.4 dg/min (as measured according to ASTM D-1238 at 300° C., 44 psi). Thirty-five parts by weight of this poly(phenylene sulfide) was then combined with 35 parts by weight of Polysulfone, 28 parts by weight of fiberglass (Owens-Corning OCF-497B) and 2 parts by weight zinc oxide in a single screw one-inch diameter extruder (L/D=20) equipped with a Maddox mixing head at about 310° C. and molded into ASTM specimens. The specimens were tested as in Controls A and B.

EXAMPLE 2

35 parts by weight of Polyarylethersulfone, 35 parts by weight of poly(ethylene terephthalate) (Cleartuf 7202A, obtained from Goodyear Tire and Rubber Co.), 20 parts by weight of fiberglass (OCF-497B, Owens-Corning Corp., Anderson, SC) and 10 parts by weight of talc (reagent grade, Mallinckrodt, Inc., Paris, KY) were blended in a single screw one-inch diameter extruder (L/D=20) equipped with a Maddox mixing head at about 275° C. and molded into ASTM specimens. The specimens were tested as in Controls A and B.

EXAMPLE 3

35 parts by weight of Polysulfone, 35 parts by weight of the poly(ethylene terephthalate) of Example 2, 20 parts by weight of fiberglass (OCF-497B, Owens-Corning Corp., Anderson, SC) and 10 parts by weight of talc (reagent grade, Mallinckrodt, Paris, KY) were mixed in a single screw one-inch diameter extruder (L/D=20) equipped with a Maddox mixing head at about 275° C. into ASTM specimens. The specimens were tested as in Controls A and B.

EXAMPLE 4

A poly(phenylene sulfide) resin (Ryton P-4 obtained from Phillips Chemical Co., Houston, TX) was placed in a pan to a depth of 2 inches. The pan was then placed in a circulating air oven at 240° C. for 17 hours to advance it. After advancing the resin had a melt flow of 1.4 dg/min as measured according to ASTM D-1238 at 300° C., 44 psi. Thirty-five parts by weight of the poly(phenylene sulfide) was blended with 35 parts by weight of Polyarylethersulfone, 28 parts by weight of muscovite mica (English Mica Co., Stamford, CT) and 2 parts by weight zinc oxide in a single screw one-inch diameter extruder (L/D=20) equipped with a Maddox mixing head at about 310° C. into ASTM specimens. The specimens were tested as in Controls A and B.

EXAMPLE 5

Thirty-five parts by weight of the advanced poly(phenylene sulfide) resin of Example 4 was blended with 35 parts by weight of Polyarylethersulfone, 28 parts by weight of fiberglass (Owens-Corning OCF-497B) and 2 parts by weight zinc oxide in a single screw one-inch diameter extruder (L/D=20) equipped with a Maddox mixing head at about 310° C. into ASTM specimens. The specimens were tested as in Controls A and B.

TABLE II

| Formulations of Examples 1 to 5 | | | | | |
|---|---|---|---|---|---|
| | Examples | | | | |
| Ingredients | 1 | 2 | 3 | 4 | 5 |
| Poly(phenylene sulfide) | 35% | — | — | 35% | 35% |
| Polysulfone | 35% | — | 35% | — | — |
| Polyarylethersulfone | — | 35% | — | 35% | 35% |
| Poly(ethylene terephthalate) | — | 35% | 35% | — | — |
| Fiberglass | 28% | 20% | 20% | — | 28% |
| Talc | — | 10% | 10% | — | — |
| Zinc Oxide | 2% | — | — | 2% | 2% |
| Mica | — | — | — | 28% | — |

Table III depicts the physical properties of the resins of Examples 1 to 5.

TABLE III

| | Examples | | | | |
|---|---|---|---|---|---|
| | 1 | 2 | 3 | 4 | 5 |
| Tensile | 15,500 | 13,200 | 14,300 | 10,600 | 15,900 |

TABLE III-continued

| | Examples | | | | |
|---|---|---|---|---|---|
| | 1 | 2 | 3 | 4 | 5 |
| Strength | | | | | |
| Tensile Modulus | 1,460,000 | 1,040,000 | 1,040,000 | 1,540,000 | 1,650,000 |
| % Elongation to Break | 1.41 | 1.54 | 1.82 | 0.89 | 1.30 |
| Flexural Strength | 23,600 | 19,000 | 20,200 | 16,700 | 24,500 |
| Flexural Modulus | 1,250,000 | 1,110,000 | 1,130,000 | 1,340,000 | 1,430,000 |
| HDT @ 264 psi | 179.0° C. | 205° C. | 182° C. | 200° C. | 209° C. |

SOLDER TEST

The formulations from Table II were injection molded into ⅛ inch thick ASTM type I tensile bars on an Arburg reciprocating screw injection molding machine. The tensile specimens were immersed in water at about 25° C. for 16 hours and then directly immersed in molten solder at 420° F. for 60, 90, and 120 seconds to simulate typical VPS exposure conditions. No distortion, bubbling, or foaming was observed.

EXAMPLE 6

Fifty parts by weight of Polyetherimide, 30 parts by weight of the advanced poly(phenylene sulfide) resin of Example 4 and 20 parts by weight of the fiberglass of Example 5 were blended as described in Example 5 and injection molded and tested as described in the SOLDER TEST.

No distortion, bubbling, or foaming of the test specimens was observed.

CONTROL C

Eighty parts by weight of Polyetherimide and 20 parts by weight of the fiberglass of Example 5 were blended as described in Example 5 and injection molded and tested as described in the SOLDER TEST.

The specimens showed foaming.

EXAMPLE 7

Fifty parts by weight of Polyarylate and 50 parts by weight of nylon 6,6(Zytel obtained from E. I. duPont De D'Nemours & Co.) were blended as described in Example 5 and injection molded and tested as described in the SOLDER TEST.

No distortion, bubbling, or foaming of the test specimens was observed.

CONTROL D

Polyarylate was injection molded and tested as described in the SOLDER TEST.

The specimens showed distortion.

What is claimed is:

1. A molded electrical device comprising an electrically conductive pathway and an insulating material, the device being capable of interconnecting with external circuitry, said insulating material being vapor phase solderable without distortion, bubbling or foaming and comprising a blend of from about 35 to 65 weight percent of an amorphous polymer selected from a polyarylether on a polyarylethersulfone and from about 65 to about 35 weight percent of a crystalline polymer selected from a polyester or a polyamide.

2. A device as defined in claim 1 wherein the material comprises a blend of from about 35 to about 65 weight percent of a polyarylether and from about 65 to 35 weight percent of a crystalline polymer selected from a polyester or a polyamide.

3. A device as defined in claim 1 wherein the insulating material comprises a blend of from about 35 to about 65 weight percent of a polyarylether and from about 65 to about 35 weight percent of a polyester.

4. A circuit board substrate made from a composition which is vapor phase solderable without distortion, bubbling or foaming comprising a blend of from about 35 to about 65 weight percent of an amorphous polymer selected from a polyarylether or a polyarylethersulfone and from about 65 to about 35 weight percent of a crystalline polymer selected from a polyester or a polyamide.

5. A substrate as defined in claim 4 made from a composition comprising a blend of from about 35 to about 65 weight percent of a polyarylether and from about 65 to about 35 weight percent of a crystalline polymer selected from a polyester or a polyamide.

6. A substrate as defined in claim 4 made from a composition comprising a blend of from about 35 to about 65 weight percent of a polyarylether and from about 65 to about 35 weight percent of a polyester.

7. A substrate as defined in claim 4 which carries an electrically conductive pathway.

8. A chip carrier made from a composition which is vapor phase solderable without distortion, bubbling or foaming, comprising from about 35 to about 65 weight percent of an amorphous polymer selected from a polyarylethersulfone or a polyarylether and from about 65 to about 35 weight percent of a crystalline polymer selected from a poly(arylene sulfide), a polyester or a polyamide.

9. A chip carrier as defined in claim 8 made from a composition comprising a blend of from about 35 to about 65 weight percent of a polyarylether and from about 65 to about 35 weight percent of a crystalline polymer selected from a polyester or a polyamide.

10. A chip carrier as defined in claim 8 made from a composition comprising a blend of from about 35 to about 65 weight percent of a polyarylether and from about 65 to about 35 weight percent of a polyester.

* * * * *

UNITED STATES PATENT AND TRADEMARK OFFICE
CERTIFICATE OF CORRECTION

PATENT NO. : 5,093,435
DATED : March 3, 1992
INVENTOR(S) : James E. Harris, et. al.

It is certified that error appears in the above-indentified patent and that said Letters Patent is hereby corrected as shown below:

Column 20, line 45, "naphtylene" should read -- naphthylene--.

Signed and Sealed this

Eleventh Day of January, 1994

Attest:

BRUCE LEHMAN

*Attesting Officer*  *Commissioner of Patents and Trademarks*